(12) United States Patent
Jung et al.

(10) Patent No.: US 7,474,566 B2
(45) Date of Patent: Jan. 6, 2009

(54) NON-VOLATILE MEMORY DEVICE AND METHOD CAPABLE OF RE-VERIFYING A VERIFIED MEMORY CELL

(75) Inventors: Kee-Ho Jung, Suwon-si (KR); Jae-Yong Jeong, Yongin-si (KR); Chi-Weon Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/763,606

(22) Filed: Jun. 15, 2007

(65) Prior Publication Data

US 2008/0158993 A1 Jul. 3, 2008

(30) Foreign Application Priority Data

Jan. 3, 2007 (KR) .................... 10-2007-0000807

(51) Int. Cl.
*G11C 16/06* (2006.01)
(52) U.S. Cl. ..................... 365/185.22; 365/185.04; 365/189.07
(58) Field of Classification Search ............ 365/185.21, 365/185.22, 185.04, 189.05, 189.07
See application file for complete search history.

(56) References Cited

U.S. PATENT DOCUMENTS

| 6,118,703 | A | 9/2000 | Hamaguchi |
| 6,560,143 | B2 | 5/2003 | Conley et al. |
| 6,801,457 | B2 * | 10/2004 | Tanzawa et al. ........ 365/185.22 |
| 6,813,207 | B2 * | 11/2004 | Honda ........................ 365/205 |
| 6,836,431 | B2 * | 12/2004 | Chang ................... 365/185.03 |
| 2007/0025158 | A1 * | 2/2007 | Kim et al. .............. 365/185.22 |

FOREIGN PATENT DOCUMENTS

| JP | 11-306770 | 11/1999 |
| JP | 2005-507129 | 3/2005 |
| KR | 100463585 B1 | 12/2004 |

* cited by examiner

*Primary Examiner*—Gene N. Auduong
(74) *Attorney, Agent, or Firm*—F. Chau & Assoc., LLC

(57) ABSTRACT

A method of driving a non-volatile memory device includes programming a plurality of memory cells based on a first data copied from a program data buffer to a verification data buffer, verifying the memory cells by overwriting a result of the verification of the programmed memory cells to a verification data buffer, and re-verifying the memory cells by repeating the programming and verifying operations at least once with respect to the memory cells that were successfully verified, based on the verification result written to the verification data buffer. A non-volatile memory device includes a program data buffer storing first data, a verification data buffer copying and storing the first data, a plurality of memory cells programmed based on the data stored in the verification data buffer, a comparator comparing data stored in the verification data buffer with data read out from the programmed memory cells and outputting comparison data generated based on a result of the comparison to the verification data buffer, and a control unit controlling the program data buffer, the verification data buffer, the memory cells, and the comparator to additionally program or verify the memory cells that were successfully verified, based on the first data.

13 Claims, 4 Drawing Sheets

NON-VOLATILE MEMORY DEVICE AND METHOD CAPABLE OF RE-VERIFYING A VERIFIED MEMORY CELL

CROSS-REFERENCE TO RELATED PATENT APPLICATION

This application claims priority under 35 U.S.C. § 119 from Korean Patent Application No. 2007-0000807, filed on Jan. 3, 2007, the disclosure of which is hereby incorporated by reference herein as if set forth in its entirety.

BACKGROUND OF THE INVENTION

1. Technical Field

The present disclosure relates to a non-volatile memory device and, more particularly, to a non-volatile memory device and method capable of programming and re-verifying a verified memory cell.

2. Discussion of Related Art

Non-volatile memory devices include a mask ROM (read only memory), an electrically erasable and programmable ROM (EEPROM), and an erasable and programmable ROM (EPROM). The EEPROM that is electrically erasable and programmable is widely used as an auxiliary memory device or for system programming that requires continuous updating.

More specifically, a flash EEPROM, hereinafter, referred as the flash memory device, that exhibits a higher degree of integration than the existing EEPROM is very advantageous for high capacity auxiliary memory devices. The flash memory device includes a NAND type, a NOR type, and an AND type. The NAND type flash memory device, which has a high degree of integration, is mainly used for storing data. The NOR type flash memory device, which has a fast data access speed, is mainly used for storing program codes.

The non-volatile memory device includes a plurality of memory cells having a MOS transistor structure with a floating gate and a control gate. The memory cells are electrically programmable and erasable.

In general, it is essential for the non-volatile memory device that is electrically programmable and erasable to be able to function to verify memory cell data. The verification function verifies whether programmed data is accurately written to a memory cell and to correct the data when inaccurate data exists.

A flash memory device having a multilevel cell, for example, a four-level cell, that has been recently developed can store 2 bits in a single cell, unlike a single level cell. The flash memory device including the multilevel memory cells in a four-level state needs a more accurate programming and verifying technique compared to a conventional flash memory device having memory cells in a two-level state. Thus, to increase the accuracy of verification, even when a verification of a programmed memory cell is successful, the flash memory device having the multilevel memory cells requires at least one re-verification of the verified memory cell.

A NOR flash memory device of a multilevel memory cell uses an algorithm of a buffer program to compensate for a program speed that is slower than a single level cell. FIG. 1 illustrates the concept of a flash memory device performing programming and verification using a conventional buffer program algorithm. Referring to FIG. 1, M number of program data PDATA, for example, #1 where M is a natural number, are stored in a program data buffer 10. A memory cell array block 20 programs a plurality of memory cells (not shown) based on the stored program data, for example, #1. The PDATA may be N bits of program data, where N is a natural number.

A memory cell array block 20 programs the memory cells and verifies the programmed memory cells. The verified results VD are written back to the program data buffer 10 and stored therein. The memory cell array block 20 overwrites a bit data corresponding to a memory cell that is successfully verified among the program data, for example, #1, stored in the program data buffer 10, as a first level value, for example, "1". The memory cell array block 20 repeats the programming and verification operations until the identification of the memory cells that are not successfully verified, and the verification results are written to the program data buffer 10.

Because the bit data corresponding to the memory cell that is successfully verified among the program data, for example, #1, stored in the program data buffer 10 is written by being corrected to the first level value, for example, "1", after the onetime verification has succeeded, the program data buffer 10 loses the original program data programmed in the memory cells. Thus, since each bit data of the program data, for example, "10101010" of #1, stored in the program data buffer 10 corresponding to the memory cell that are successfully verified once, is changed to the first level value, for example, "11111111" of #1', it is a problem that additional programming and verification cannot be performed with respect to the memory cell that has been successfully verified once.

SUMMARY OF THE INVENTION

To solve the above and/or other problems, exemplary embodiments of the present invention provide a non-volatile memory device and method capable of additionally programming and verifying a memory cell of a non-volatile memory device that has been successfully verified.

According to an exemplary embodiment of the present invention, a method of driving a nonvolatile memory device comprises programming a plurality of memory cells based on a first data copied from a program data buffer to a verification data buffer, verifying the memory cells by overwriting a result of the verification of the programmed memory cells to a verification data buffer, and re-verifying the memory cells by repeating the programming and verifying operations at least once with respect to the memory cells that are successfully verified, based on the verification result written to the verification data buffer.

The method may further comprise repeating the programming and verifying operations until verifications of the memory cells, which are not successfully verified of the memory cells programmed based on the first data, succeed.

The verification operation may comprise comparing the first data with data read out from the programmed memory cells for each corresponding bit, and outputting comparison data based on a result of the comparison and writing the comparison data to the verification data buffer.

In the outputting of the comparison data, when the corresponding bits of the first data and the read-out data match each other, the comparison data including a comparison bit having a first level value may be output.

In the re-verifying of the memory cells, when all comparison bits of the comparison data have the first level value, the programming and verifying operations may be performed at least one more time.

The method may further comprise copying the first data of M number of program data from the program data buffer where the M number of program data are stored to the verification data buffer.

The method may further comprise performing the copying, programming, verifying, and re-verifying operations with respect to each of the data except for the first data of the M number of program data.

According to an exemplary embodiment of the present invention, a non-volatile memory device comprises a program data buffer storing first data, a verification data buffer copying and storing the first data stored in the program data buffer, a plurality of memory cells programmed based on the data stored in the verification data buffer, a comparator comparing data stored in the verification data buffer with data read out from the programmed memory cells and outputting comparison data generated based on a result of the comparison to the verification data buffer to store the comparison data in the verification data buffer, and a control unit controlling the program data buffer, the verification data buffer, the memory cells, and the comparator to additionally program or verify the memory cells that are successfully verified, based on the first data.

The comparator may compare the first data with the data read out from the programmed memory cells for each corresponding bit and output comparison data including a comparison bit having a first level value to the verification data buffer when values of the corresponding bits match each other.

The verification data buffer corrects the stored data based on the comparison data and stores the corrected data.

The control unit controls recopying of the first data from the program data buffer to the verification data buffer for additional programming and verification of the programmed memory cells when all bits stored in the verification data buffer have the first level value.

The control unit controls the program data buffer, the verification data buffer, the comparator, and the verified memory cells to program and re-verify the verified memory cells based on the recopied first data.

The control unit outputs a plurality of control signals, the verification data buffer copies and stores the first data stored in the program data buffer in response to a first control signal of the control signals, the memory cells may be programmed based on the first data stored in the verification data buffer or the comparison data in response to a second control signal of the control signals, the comparator compares the first data with the data read out from the programmed memory cells and outputs comparison data to the verification data buffer based on a result of the comparison in response to a third control signal of the control signals, and the control unit determines the success of verification of the programmed memory cell based on the comparison data and outputs the first control signal, the second control signal, and the third control signal for additional programming and verification of the verified memory cells.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
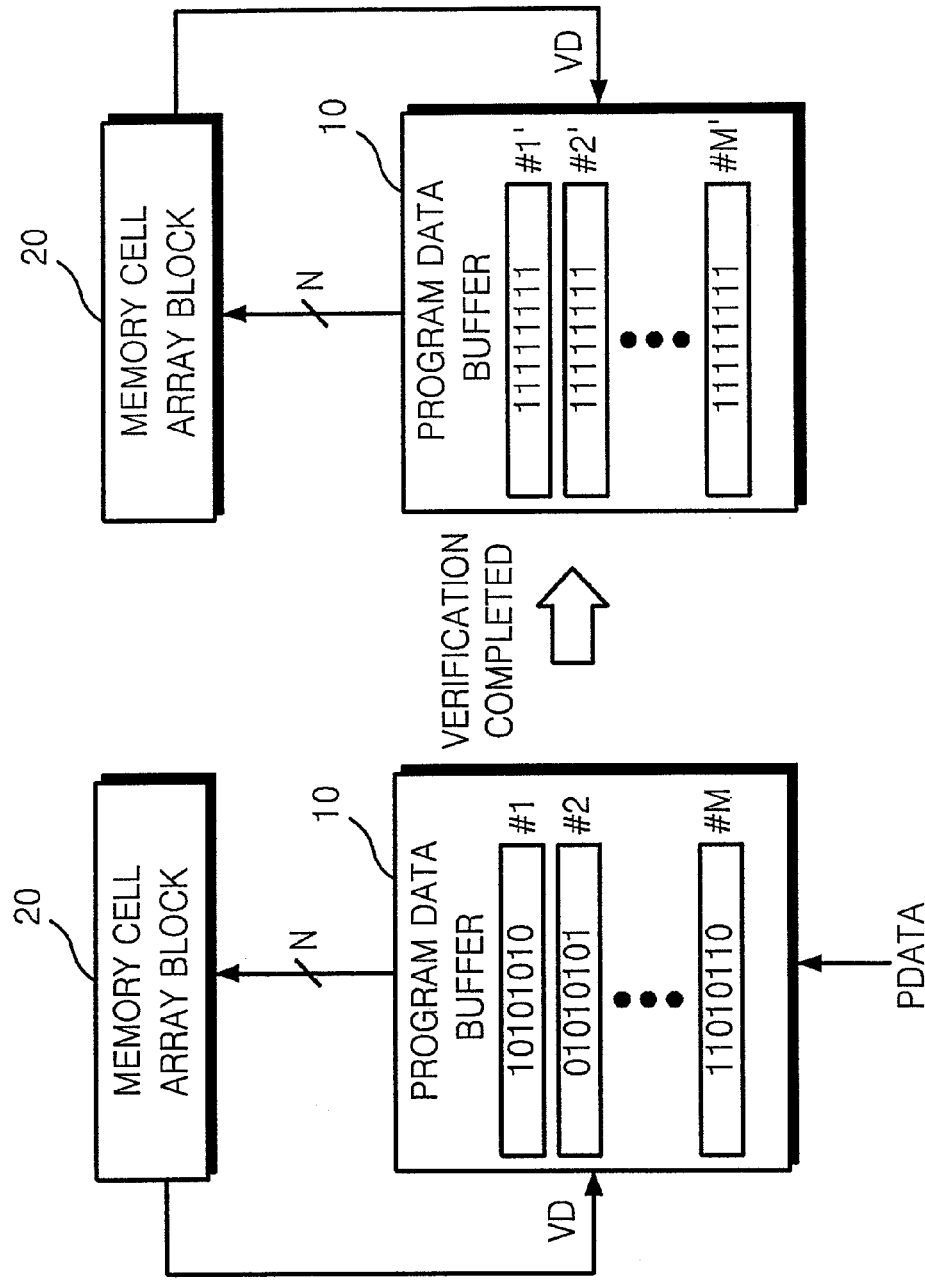
FIG. 1 illustrates the concept of a flash memory device performing programming and verification using a conventional buffer program algorithm.

Hereinafter, the present invention will be described in detail by explaining exemplary embodiments of the present invention with reference to the attached drawings. Like reference numerals in the drawings denote like elements.

Figure 2:
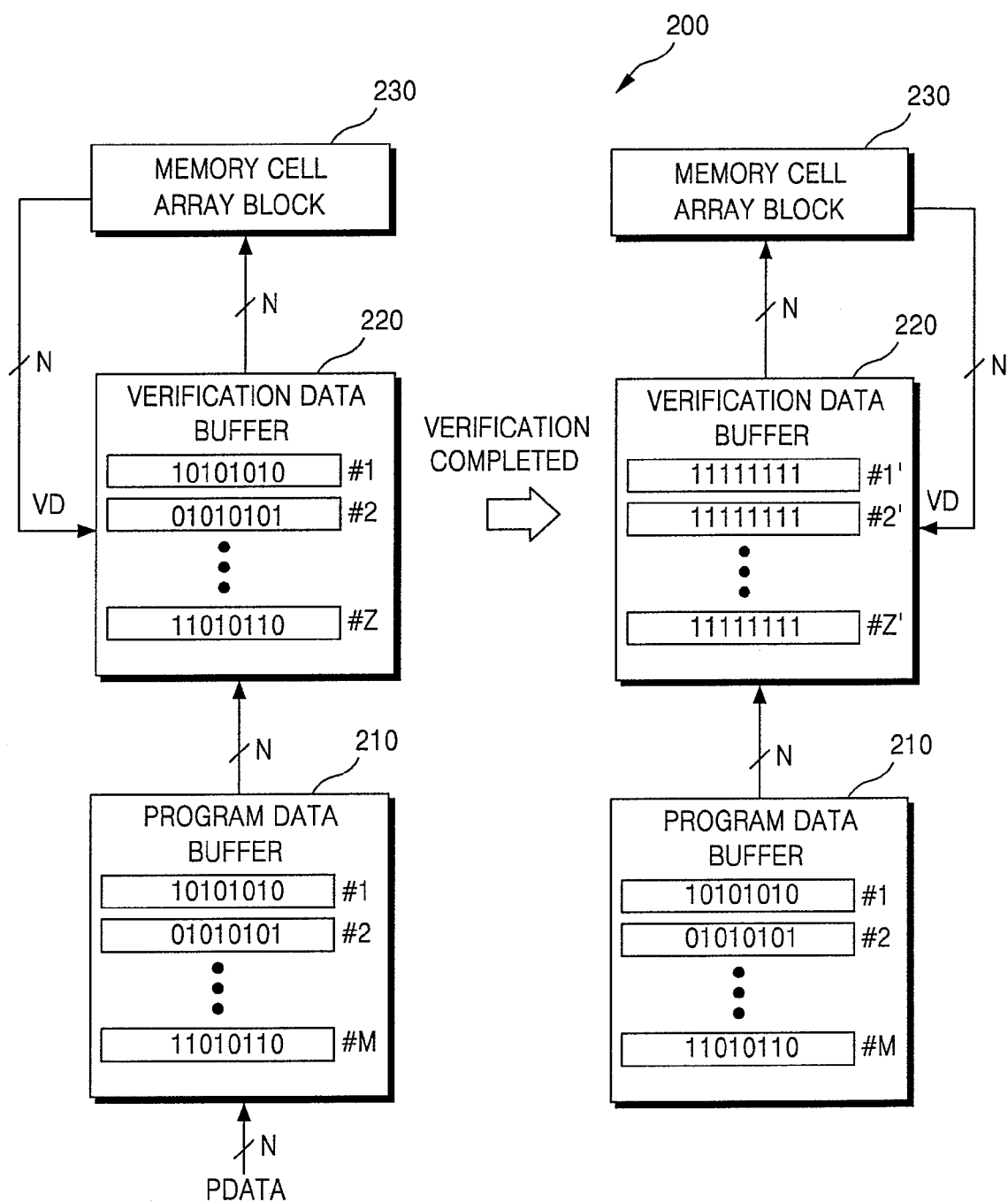
FIG. 2 illustrates the concept of a non-volatile memory device according to an exemplary embodiment of the present invention.

FIG. 2 illustrates a non-volatile memory device 200 according to an exemplary embodiment of the present invention. Referring to FIG. 2, the non-volatile memory device 200 includes a program data buffer 210, a verification data buffer 220, and a memory cell array block 230.

The program data buffer 210 stores a program data PDATA that is predetermined and input from the outside. The program data buffer 210 can store M number of N bits of program data #1 through #M, where M is a natural number and N is a real number, for example, N=8. The program data PDATA can be in units of words.

The verification data buffer 220 copies and stores the program data stored in the program data buffer 210. The data storage capacity of the verification data buffer 220 can be equal to or less than the data storage capacity of the program data buffer 210. For example, the verification data buffer 220 copies and stores Z number of the program data, for example, #1 through #Z, where Z is a natural number satisfying the relationship $Z \leq M$, of the M number of the program data #1 through #M stored in the program data buffer 210.

The memory cell array block 230 is a functional block that includes a plurality of memory cells (not shown) and a plurality of peripheral circuits (not shown). The memory cell array block 230 programs the memory cells based on the program data, for example, #1 through #Z, copied to the verification data buffer 220, and verifies the programmed memory cells. Thus, the memory cell array block 230 can program first memory cells of the memory cells based on the first data #1 and verify the programmed data.

More specifically, the memory cell array block 230 programs any one unit memory cell, for example, a multilevel cell capable of storing 2 bits, of the first memory cells based on 2 bit data, for example, "10", that is predetermined and included in the first data #1, for example, "10101010". The memory cell array block 230 corrects the first data, for example, #1, stored in the verification data buffer 220 based on the verification result VD of the programmed unit memory cell, for example, the multilevel cell capable of storing 2 bits.

When the verification of the programmed unit memory cell is successful, the memory cell array block 230 corrects the predetermined 2 bit data, for example, "10", included in the first data #1 for example, "10101010", stored in the verification data buffer 220, to a verification success data value, for example, "11." Thus, the corrected first data #1', for example, "11101010", is stored in the verification data buffer 220.

The memory cell array block 230 repeats the programming and verification until the verification of only the memory cells, which have not been not successfully verified, of the programmed memory cells succeeds based on the corrected first data #1, for example, "11101010". This is because the programming of the verified memory cell can be inhibited.

Accordingly, as shown in FIG. 2, when all verifications of the memory cells programmed based on the first data #1, for example, "10101010", succeed, the first data, for example, #1, stored in the verification data buffer 220 is corrected to the verification success data values #1', for example, "11111111", and stored. Even when all verifications of the memory cells programmed based on the program data #1, for example, "10101010", stored in the verification data buffer 220 have succeeded, the program data buffer 210 maintains the program data, for example, #1, without change.

Thus, even when all of the first-time verifications of the programmed memory cells are successful, only the program data, for example, #1, stored in the verification data buffer 220 is corrected. Accordingly, additional programming and verification of the memory cells can be repeated by copying the program data #1, for example, "10101010", stored in the program data buffer 210 to the verification data buffer 220. Therefore, as described above, since the re-verification of the memory cell that has been successfully verified once is possible, more accurate programming of the multilevel memory cells is possible.

Figure 3:
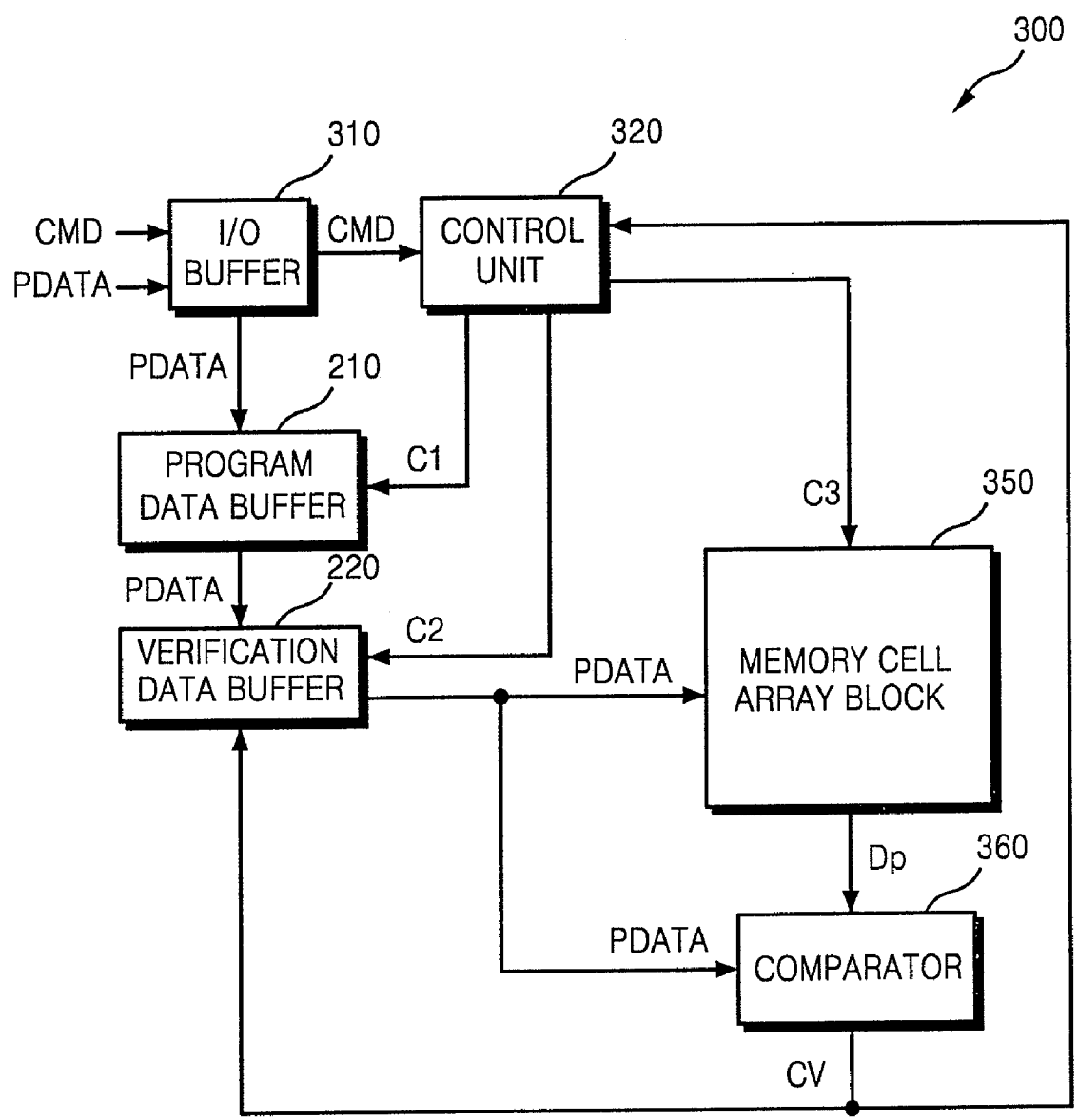
FIG. 3 illustrates the configuration of a non-volatile memory device according to an exemplary embodiment of the present invention.

FIG. 3 illustrates the configuration of a non-volatile memory device 300 according to an exemplary embodiment of the present invention. Referring to FIG. 3, the non-volatile memory device 300 includes an I/O buffer 310, a control unit 320, the program data buffer 210, the verification data buffer 220, a memory cell array block 350, and a comparator 360.

The control unit 320 outputs a plurality of control signals C1, C2, and C3 based on a predetermined command CMD input from the outside of the non-volatile memory device 300 through the I/O buffer 310. The program data buffer 210 in response to the first control signal C1 stores the program data PDATA input through the I/O buffer 220. The verification data buffer 220 in response to the second control signal C2 copies and stores the program data PDATA stored in the program data buffer 210.

The memory cell array block 350 includes a plurality of memory cells (not shown), a detection and amplification unit (not shown) for reading out memory cell data from addressed memory cells, an address decoder (not shown) for decoding addresses of the memory cells, and a write driver (not shown) to write program data to the memory cells. The memory cell array block 350, in response to the third control signal C3, programs predetermined memory cells based on the program data PDATA, for example, #1, stored in the verification data buffer 220.

The third control signal C3 includes a write enable signal W/E, and X-address and Y-address to set the addresses of the predetermined memory cells. The comparator 360 compares the program data PDATA with data Dp read out from each of the memory cells programmed based on the program data PDATA, and outputs comparison data CV based on the result of the comparison. More specifically, the comparator 360 compares the predetermined 2 bits, for example, "01", of the program data, for example, the first data #1, stored in the verification data buffer 220 and the data read out from the memory cell programmed based on the predetermined 2 bits.

When the present 2 bits match the read-out data, the comparator 360 outputs the comparison data CV including the first level values, for example, "11", to the verification data buffer 220 and the control unit 320. The program data, for example, the first data #1, stored in the verification data buffer 220 is corrected and the corrected data, for example, #1' shown in FIG. 2, is stored.

The control unit 320 determines based on the comparison data CV, whether the verification of the data Dp read out from each of the programmed memory cells is successful. The control unit 320 outputs the control signals C1, C2, and C3 to control the program data buffer 210, the verification data buffer 220, the memory cell array block 350, and the comparator 360 for the additional programming or verification based on the program data, for example, the first data #1, stored in the program data buffer 210 with respect to the verified memory cells.

Figure 4:
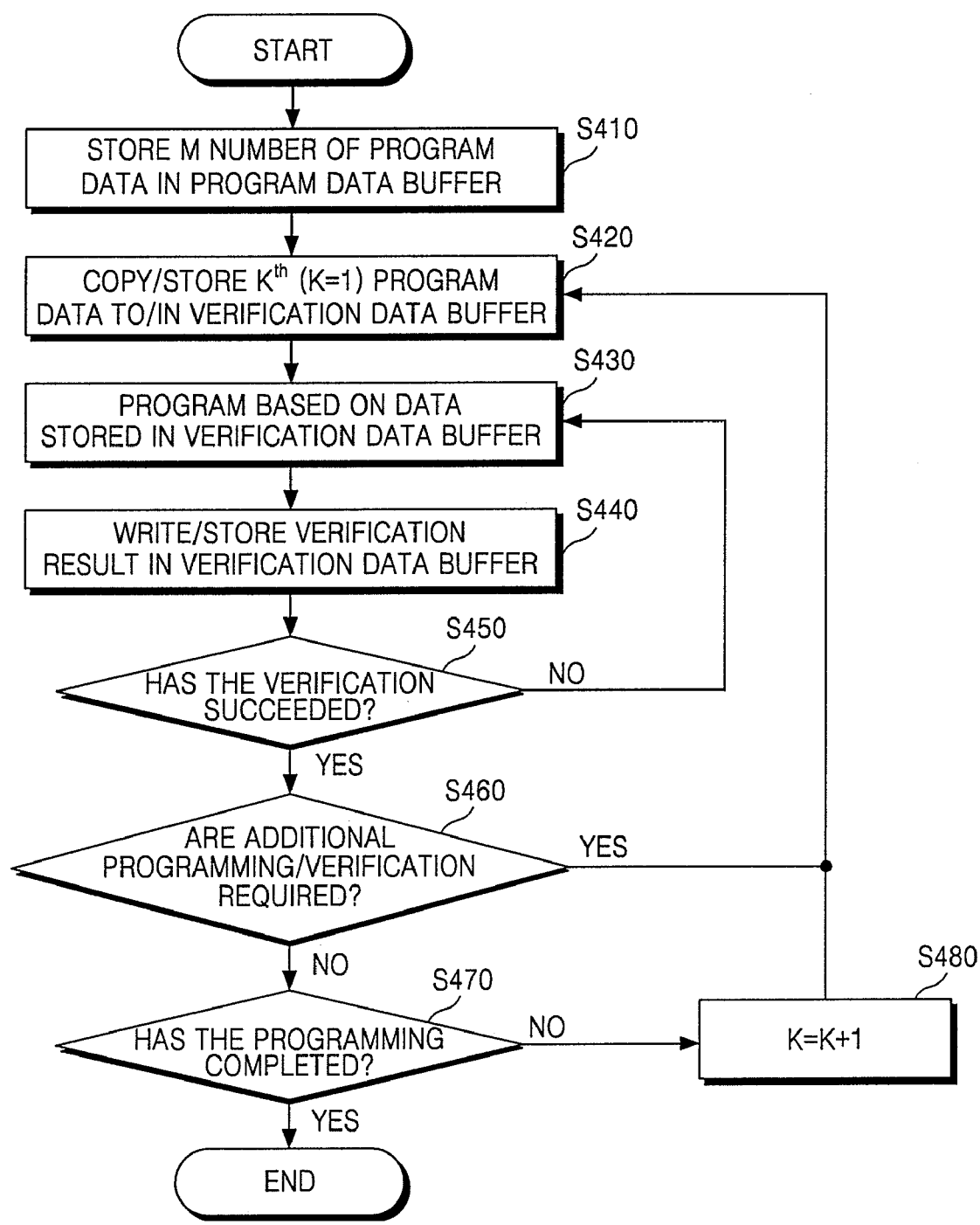
FIG. 4 is a flow chart for explaining a method of driving the non-volatile memory device of FIG. 3.

FIG. 4 is a flow chart for explaining a method of driving the nonvolatile memory device of FIG. 3. Referring to FIGS. 2 through 4, the M number of the program data PDATA, for example, #1 through #M, input from the outside, where M is a natural number, is stored in the program data buffer 210 (S410). Each of the M number of the program data PDATA can be an N bit, where N is a real number.

The Z number, where Z is a natural number satisfying the relationship $Z \leq M$, of the program data, for example, the $K^{th}$ program data #1 through #Z, where K=1 of the M number of the program data, for example, #1 through #M, is copied to the verification data buffer 220 and stored (S420). The predetermined memory cells of the memory cell array block 350 can be programmed based on the first data, for example, #1, of the Z number of the program data, for example, #1 through #Z, stored in the verification data buffer 220(S430).

The programmed memory cells are verified and the result of the verification is overwritten to the verification data buffer 220 (S440). The first data, for example, #1, and the data read out from the memory cells programmed based on the first data, for example, #1, are compared with each other for each corresponding bit. The comparison data CV is output based on the comparison result. The comparison data CV can be overwritten instead of the first data, for example, #1, stored in the verification data buffer 220. For example, the comparison data CV includes a comparison bit having a first level value, for example, "1", when the present bit of the first data, for example, #1, and the bit of the data read out from the memory cell programmed based on the predetermined bit match each other.

For the multilevel memory cell, when the predetermined 2 bits included in the first data, for example, #1, and the 2 bit data read out from the memory cell programmed based on the predetermined 2 bits match each other, the comparison data CV may include comparison bits "11" having the first level value "1". The programming step (S430) and the verification step (S440) can be repeated until the verification of the memory cells that were not successfully verified, based on the comparison data written to the verification data buffer 220 (S450).

The copying step (S420), the programming step (S430), and the verification steps (S440 and S450) are repeated at least one time with respect to the memory cells that are successfully verified, based on the result of the verification written to the verification data buffer 220 (S440). For example, when the verifications of the memory cells programmed based on the first data #1 stored in the verification data buffer 220 are all successful, that is, when all of the data stored in the verification data buffer 220 are the first level values, for example, #1', that is, "1111111", the steps (S420 through S460) are repeated at least once more.

The necessity of the additional programming and verification, that is, re-verification, or the number of the additional verification can be predetermined. For example, when the additional verification number is 3, the steps (S420 through S460) can be repeated three times.

Whether the programming of the memory cells based on all of the program data #1 through #M stored in the program data buffer 210 has been completed is determined (S470). When the programming is not completed, the $K^{th}$ program data, where K is 2, of the M number of program data stored in the program data buffer 210 is incremented S480) and copied to the verification data buffer (S420) and the steps (S420 through S480) are repeated until the programming is completed (S470).

The present invention can also be exemplarily embodied as computer readable codes on a computer readable recording medium. The computer readable recording medium is any data storage device that can store data that can be thereafter read by a computer system. Also, functional programs, codes, and code segments for accomplishing exemplary embodiments of the present invention can be easily construed by programmers of ordinary skill in the art to which the present invention pertains.

While this invention has been particularly shown and described with reference to exemplary embodiments thereat it will be understood by those of ordinary skill in the art that various changes in form and details may be made therein without departing from the spirit and scope of the invention, as defined by the appended claims.

As described above, in the non-volatile memory device and driving method according to exemplary embodiments of the present invention, additional verification is possible for the programmed memory cells that have been successfully verified, whereby the accuracy in programming the memory cells can be increased.

What is claimed is:

1. A method of driving a non-volatile memory device, the method comprising:
   programming a plurality of memory cells based on a first data copied from a program data buffer to a verification data buffer;
   verifying the plurality of memory cells by overwriting a result of the verification of the programmed memory cells to a verification data buffer; and
   re-verifying the plurality of memory cells by repeating the programming and verifying operations at least once again with respect to the memory cells that were successfully verified, based on the verification result written to the verification data buffer.

2. The method of claim 1, further comprising repeating the programming and verifying operations until verifications succeed of the memory cells that were not successfully verified of the memory cells programmed based on the first data.

3. The method of claim 2, wherein the verification operation comprises:
   comparing the first data with data read out from the programmed memory cells for each corresponding bit, and outputting comparison data based on a result of the comparison; and
   writing the comparison data to the verification data buffer.

4. The method of claim 3, wherein, in the outputting of the comparison data, when the corresponding bits of the first data and the read-out data match each other, the comparison data including a comparison bit having a first level value is output.

5. The method of claim 4, wherein, in the re-verifying of the memory cells, when all comparison bits of the comparison data have the first level value, the programming and verifying operations are performed at least one more time.

6. The method of claim 1, further comprising copying the first data of M number of program data from the program data buffer, where the M number of program data are stored to the verification data buffer.

7. The method of claim 6, further comprising performing the copying, programming, verifying, and re-verifying operations with respect to each of the data except for the first data of the M number of program data.

8. A non-volatile memory device comprising:
   a program data buffer storing first data;
   a verification data buffer copying and storing the first data stored in the program data buffer;
   a plurality of memory cells programmed based on the data stored in the verification data buffer;
   a comparator comparing data stored in the verification data buffer with data read out from the plurality of programmed memory cells and outputting comparison data generated based on a result of the comparison to the verification data buffer to store the comparison data in the verification data buffer; and
   a control unit controlling the program data buffer, the verification data buffer, the memory cells, and the comparator to additionally program or verify the memory cells that were successfully verified, based on the first data.

9. The non-volatile memory device of claim 8, wherein the comparator compares the first data with the data read out from the programmed memory cells for each corresponding bit and outputs comparison data including a comparison bit having a first level value to the verification data buffer when values of the corresponding bits match each other.

10. The non-volatile memory device of claim 9, wherein the verification data buffer corrects the stored data based on the comparison data and stores corrected data.

11. The non-volatile memory device of claim 10, wherein the control unit controls recopying of the first data from the program data buffer to the verification data buffer for additional programming and verification of the programmed memory cells when all bits stored in the verification data buffer have the first level value.

12. The non-volatile memory device of claim 11, wherein the control unit controls the program data buffer, the verification data buffer, the comparator, and the verified memory cells to program and re-verify the verified memory cells based on the recopied first data.

13. The non-volatile memory device of claim 11, wherein the control unit outputs a plurality of control signals, the verification data buffer copies and stores the first data stored in the program data buffer in response to a first control signal of the plurality of control signals, the memory cells are programmed based on the first data stored in the verification data buffer or the comparison data in response to a second control signal of the plurality of control signals, the comparator compares the first data with the data read out from the programmed memory cells and outputs comparison data to the verification data buffer based on a result of the comparison in response to a third control signal of the plurality of control signals, and the control unit determines the success of verification of the programmed memory cell based on the comparison data and outputs the first control signal, the second control signal, and the third control signal for additional programming and verification of the verified memory cells.

* * * * *